US009173266B2

(12) United States Patent
Liao et al.

(10) Patent No.: US 9,173,266 B2
(45) Date of Patent: Oct. 27, 2015

(54) ILLUMINATION APPARATUS AND METHOD FOR GENERATING WHITE LIGHT

(75) Inventors: Wen-Chia Liao, Taoyuan Hsien (TW); Li-Fan Lin, Taoyuan Hsien (TW); Ching-Chuan Shiue, Taoyuan Hsien (TW); Shih-Peng Chen, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 133 days.

(21) Appl. No.: 13/551,854

(22) Filed: Jul. 18, 2012

(65) Prior Publication Data

US 2013/0271029 A1 Oct. 17, 2013

(30) Foreign Application Priority Data

Apr. 17, 2012 (TW) ............................ 101113540 A

(51) Int. Cl.

*H01L 33/50* (2010.01)
*H05B 33/08* (2006.01)
*F21Y 101/02* (2006.01)
*F21Y 103/00* (2006.01)
*F21Y 113/00* (2006.01)

(52) U.S. Cl.

CPC ......... *H05B 33/0857* (2013.01); *F21Y 2101/02* (2013.01); *F21Y 2103/003* (2013.01); *F21Y 2113/005* (2013.01)

(58) Field of Classification Search

USPC .................................................. 313/483–484
See application file for complete search history.

(56) References Cited

U.S. PATENT DOCUMENTS

| | | | | |
|---|---|---|---|---|
| 5,801,063 | A | 9/1998 | Grandies et al. | |
| 6,379,022 | B1 | 4/2002 | Amerson et al. | |
| 7,014,336 | B1 | 3/2006 | Ducharme et al. | |
| 7,679,281 | B2 | 3/2010 | Kim et al. | |
| 2009/0140630 | A1 * | 6/2009 | Kijima et al. | 313/498 |

FOREIGN PATENT DOCUMENTS

| | | | |
|---|---|---|---|
| TW | 201211442 | A | 3/2012 |

* cited by examiner

*Primary Examiner* — Mariceli Santiago
*Assistant Examiner* — Brenitra M Lee
(74) *Attorney, Agent, or Firm* — Muncy, Geissler, Olds & Lowe, P.C.

(57) ABSTRACT

An illumination apparatus includes a first light-emitting device, a second light-emitting device, and a third light-emitting device. The light emitted from the third light-emitting device is selectively mixed with the light emitted from the first light-emitting device or the second light-emitting device to form a white light having a chromaticity coordinate point substantially located on a Black Body Locus. A color of the light emitted from the third light-emitting device is determined by linear relationships between chromaticity coordinate points corresponding to wavelengths of the lights emitted form the first light-emitting device and the second light-emitting device and corresponding to a color temperature of the white light. A method for generating a white light is also disclosed herein.

24 Claims, 8 Drawing Sheets

100

ILLUMINATION APPARATUS AND METHOD FOR GENERATING WHITE LIGHT

RELATED APPLICATIONS

This application claims priority to Taiwan Patent Application Serial Number 101113540, filed on Apr. 17, 2012, which is herein incorporated by reference.

BACKGROUND

1. Technical Field

The present invention relates to an illumination apparatus. More particularly, the present invention relates to an illumination apparatus with variable color temperature.

2. Description of Related Art

With the advance of technology, demands of illumination for users increase daily, and requirements of illumination quality for users gradually increase as well. Recently, traditional light sources have been replaced by light-emitting diodes (LEDs) gradually because the LEDs have advantages such as better light-emitting efficiency, long lifetime, high reliability, small volume, etc., compared to the traditional light sources, and thus the LEDs are widely applicable.

For a present illumination apparatus which is capable of generating white light, an operation of light mixture is performed with a device for generating warm white light and a device for generating cold white light such that the illumination apparatus can emit corresponding white light according to different configurations.

However, in the aforementioned operation, a chromaticity coordinate point on a CIE chromaticity diagram, which represents the white light formed by light mixture, usually cannot be accurately located on a Black Body Locus (BBL) such that the color of the white light formed according to the aforementioned operation has an apparent deviation.

Furthermore, when the illumination apparatus emits corresponding white light according to different configurations, the light-emitting devices therein must be controlled to be fully bright or fully dark, and thus the aforementioned operation of light mixture cannot be performed flexibly and the color of the white light formed by the operation of light mixture will be non-uniform.

Moreover, in order to place the devices which generate the warm white light and the cold white light in a same lamp for convenience of the operation of light mixture, a large number of LEDs have to be disposed in the same lamp based on the aforementioned operation, thereby causing an increase of the production cost and further resulting in an expensive price of the illumination apparatus, and even the size of the illumination apparatus itself cannot be significantly reduced.

SUMMARY

An aspect of the present invention is related to an illumination apparatus. The illumination apparatus includes a first light-emitting device, a second light-emitting device and a third light-emitting device. The first light-emitting device is configured for emitting a light having a first wavelength. The second light-emitting device is configured for emitting a light having a second wavelength. The third light-emitting device is configured for emitting a light having a third wavelength to be selectively mixed with the light having the first wavelength or the light having the second wavelength to form a white light represented by a chromaticity coordinate point substantially located on a Black Body Locus on a CIE chromaticity diagram. A color of the light having the third wavelength is determined by a linear relationship between corresponding coordinate points which represent the light having the first wavelength and a white light having a first color temperature on the CIE chromaticity diagram, and by a linear relationship between corresponding coordinate points which represent the light having the second wavelength and a white light having a second color temperature on the CIE chromaticity diagram.

Another aspect of the present invention is related to an illumination apparatus. The illumination apparatus includes a first light-emitting device, a second light-emitting device and a third light-emitting device. The first light-emitting device is configured for emitting a light having a first wavelength. The second light-emitting device is configured for emitting a light having a second wavelength. The third light-emitting device is configured for emitting a light having a third wavelength to be mixed with the light having the first wavelength to form a white light having a maximum color temperature within a color temperature range and represented by a chromaticity coordinate point substantially located on a Black Body Locus on a CIE chromaticity diagram, or to be mixed with the light having the second wavelength to form a white light having a minimum color temperature within the color temperature range and represented by another chromaticity coordinate point substantially located on the Black Body Locus.

Still another aspect of the present invention is related to a method for generating a white light. The method for generating the white light includes the operations below. A first extension line is fitted through a coordinate point which represents a light having a first wavelength and a coordinate point which represents a white light having a maximum color temperature within a color temperature range and is substantially located on a Black Body Locus on a CIE chromaticity diagram. A second extension line is fitted through a coordinate point which represents a light having a second wavelength and a coordinate point which represents a white light having a minimum color temperature within the color temperature range and is substantially located on the Black Body Locus. A light having a third wavelength is provided according to fitting results to be selectively mixed with the light having the first wavelength or the light having the second wavelength to form a white light, wherein a coordinate point which represents the light having the third wavelength on the CIE chromaticity diagram is substantially located where the first extension line intersects with the second extension line.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following description, specific details are presented to provide a thorough understanding of the embodiments of the present invention. Persons of ordinary skill in the art will recognize, however, that the present invention can be practiced without one or more of the specific details, or in combination with other components. Well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the disclosure or of any exemplified term. Likewise, the present invention is not limited to various embodiments given in this specification.

Figure 1:
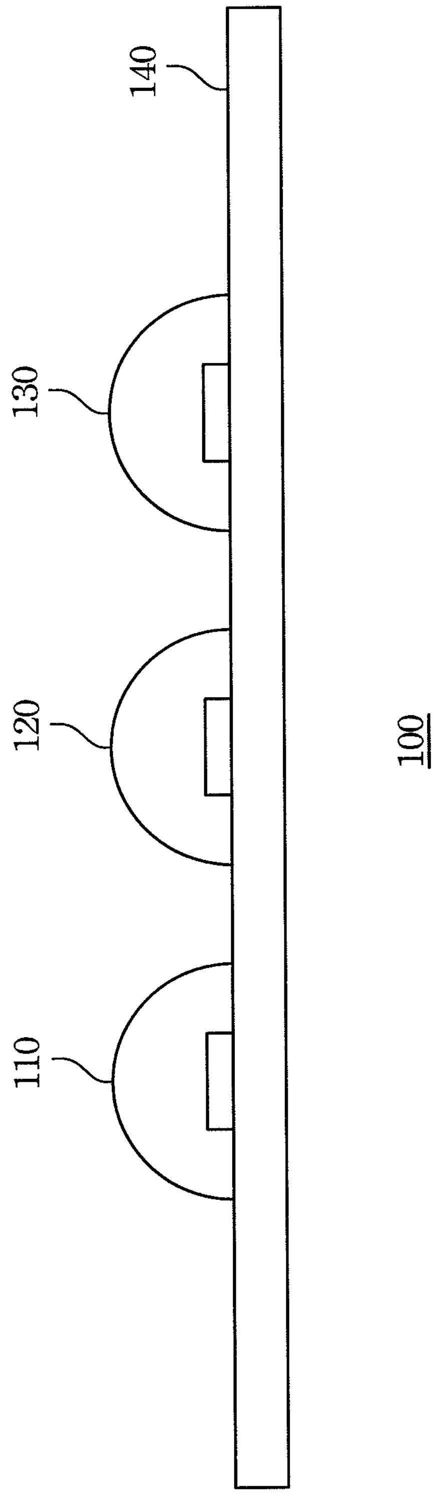
FIG. 1 is a schematic diagram illustrating an illumination apparatus according to one embodiment of the present invention.

FIG. 1 is a schematic diagram illustrating an illumination apparatus according to one embodiment of the present invention. The illumination apparatus 100 includes a first light-emitting device 110, a second light-emitting device 120, a third light-emitting device 130 and a carrier 140, wherein the first light-emitting device 110, the second light-emitting device 120, and the third light-emitting device 130 are disposed on the carrier 140, and the light respectively emitted by the first light-emitting device 110, the second light-emitting device 120 and the third light-emitting device 130 are selectively mixed to form a white light. It is notable that the structure in FIG. 1 is schematically shown for convenience of illustration and is not limiting of the present invention.

The first light-emitting device 110 is configured for emitting a light having a first wavelength smaller than approximately 480 nm. The second light-emitting device 120 is configured for emitting a light having a second wavelength greater than approximately 570 nm. The third light-emitting device is configured for emitting a light having a third wavelength to be selectively mixed with the light having the first wavelength and the light having the second wavelength to form a white light represented by a chromaticity coordinate point substantially located on a Black Body Locus (BBL) on a CIE chromaticity diagram (e.g., CIE 1931 chromaticity diagram). A color of the light having the third wavelength is mainly determined by a linear relationship between corresponding coordinate points which represent the light having the first wavelength and a white light having a first color temperature on the CIE chromaticity diagram, and by a linear relationship between corresponding coordinate points which represent the light having the second wavelength and a white light having a second color temperature on the CIE chromaticity diagram.

The description that the white light is represented by the chromaticity coordinate point (or coordinate point) substantially located on the Black Body Locus, mentioned above and below, means that the corresponding chromaticity coordinate point which represents the white light is accurately located on the Black Body Locus, or that a deviation between the corresponding chromaticity coordinate point and each of coordinate points on the Black Body Locus is 10 percent of a given range of error, or more preferably within 5 percent of a given range of error.

In one embodiment, each of the first light-emitting device 110 and the second light-emitting device 120 can be implemented by a light-emitting die, a light-emitting diode (LED) chip or other light-emitting devices (or light-emitting sources), and the third light-emitting device 130 can be implemented by coating fluorescent powder on a light-emitting die or a light-emitting diode (LED) chip.

Notably, the light emitted by the aforementioned devices is not limited by a specific manner; in other words, the aforementioned devices can simply be luminescent elements or can be luminescent elements with fluorescent material, and persons of ordinary skill in the art may use various modifications of light-emitting sources or light-emitting sources collocated with fluorescent material, included within the spirit and scope of the appended claims, to implement the aforementioned light-emitting devices and to realize the result of generating the white light by mixing the light emitted by the light-emitting devices.

Figure 2:
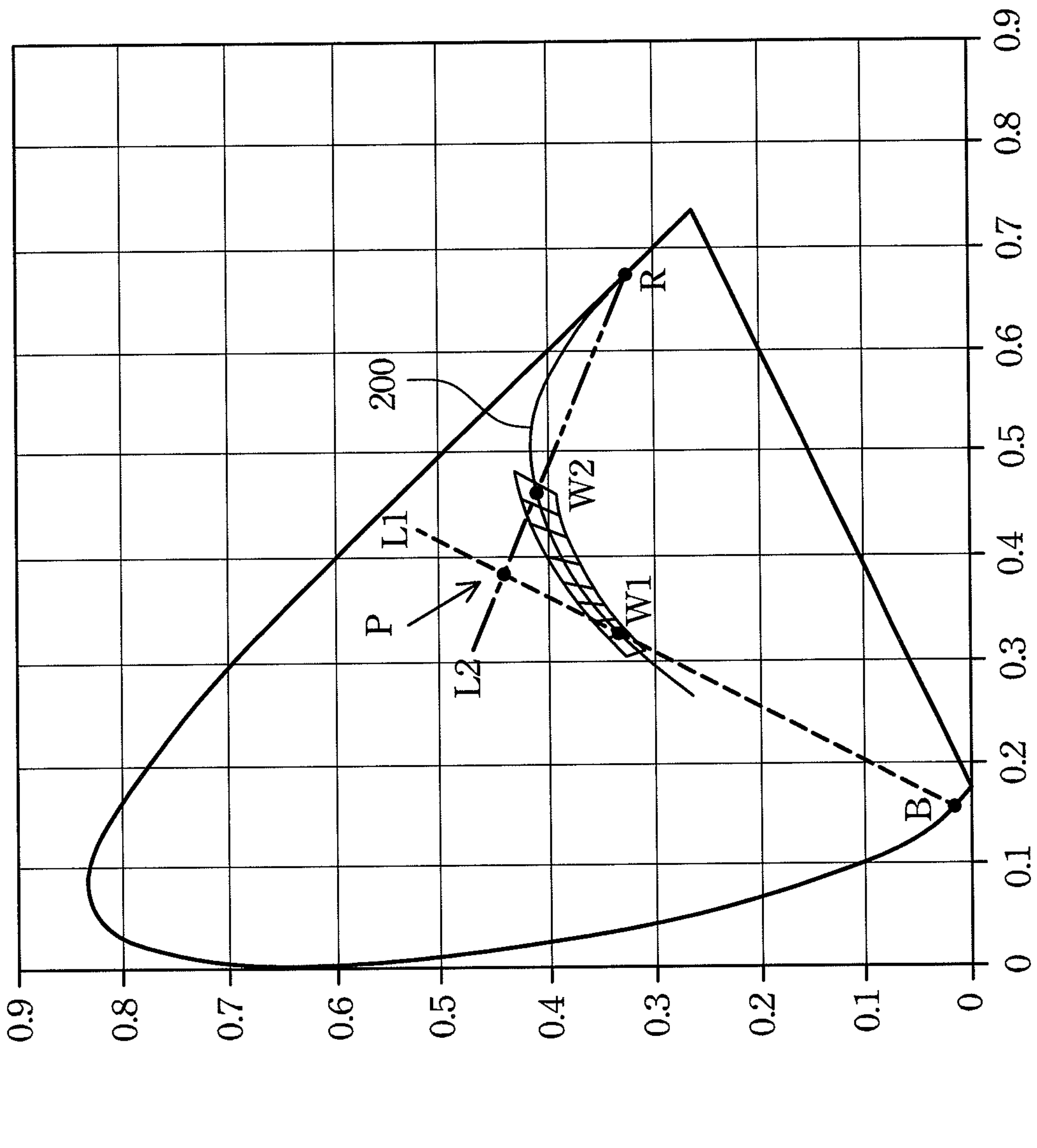
FIG. 2 is a schematic diagram illustrating a CIE chromaticity diagram and a condition thereon that chromaticity coordinate points are fitted according to one embodiment of the present invention.

Embodiments are provided below to describe the manner of determining the color of the light having the third wavelength by the linear relationships between the corresponding coordinate points on the CIE chromaticity diagram. FIG. 2 is a schematic diagram illustrating a CIE chromaticity diagram and a condition thereon that chromaticity coordinate points are fitted according to one embodiment of the present invention. Referring to both FIG. 1 and FIG. 2, the light having the first wavelength, e.g., a blue light, is represented by a coordinate point B on the chromaticity diagram, the light having the second wavelength, e.g., a red light, is represented by a coordinate point R on the chromaticity diagram, the white light having the first color temperature and the white light having the second color temperature are respectively represented by coordinate points W1, W2 on the chromaticity diagram, and the coordinate points W1, W2 are substantially located on a Black Body Locus 200. Moreover, a first extension line L1 is fitted through the coordinate point B and the coordinate point W1, a second extension line L2 is fitted through the coordinate point R and the coordinate point W2, and a coordinate point which represents the light having the third wavelength, e.g., a specific fluorescent light including the blue light, on the CIE chromaticity diagram, is substantially located where the first extension line L1 intersects with the second extension line L2, i.e., a coordinate point P. Therefore, the light having the third wavelength (which is represented by the coordinate point P), emitted by the third light-emitting device 130, can be selectively mixed with the light having the first wavelength (which is represented by the coordinate point B), which is emitted by the first light-emitting device 110, and the light having the second wavelength (which is represented by the coordinate point R), which is emitted by the second light-emitting device 120, to form the white light represented by the coordinate point located on the Black Body Locus 200. As a result, the coordinate point which represents the formed white light can be accurately located on the Black Body Locus 200, thereby preventing the color of the formed white light from being apparently deviated, and the operation of light mixture can be performed more flexibly such that the color of the white light formed by the operation of light mixture is relatively uniform.

In one embodiment, the light having the third wavelength (which is represented by the coordinate point P) can be mixed with the light having the first wavelength (which is represented by the coordinate point B) to form the white light having the first color temperature (which is represented by the coordinate point W1), and the light having the third wavelength can be mixed with the light having the second wavelength (which is represented by the coordinate point R) to form the white light having the second color temperature (which is represented by the coordinate point W2).

In addition, the coordinate point P, which represents the light having the third wavelength on the CIE chromaticity diagram, is not located on the Black Body Locus 200. Therefore, the white light represented by the coordinate point substantially located on the Black Body Locus 200 on the chromaticity diagram can be formed by modifying and mixing the light having the first wavelength, the light having the second wavelength and the light having the third wavelength.

In another embodiment, the white light having the first color temperature (which is represented by the coordinate point W1) can be a cold white light having a maximum color temperature (e.g., 5000 K) within a color temperature range, and the white light having the second color temperature (which is represented by the coordinate point W2) can be a warm white light having a minimum color temperature (e.g., 2700 K) within the color temperature range. Moreover, the light having the third wavelength (which is represented by the coordinate point P) can be mixed with the light having the first wavelength or the blue light to form the cold white light having the maximum color temperature, and the light having the third wavelength can be mixed with the light having the second wavelength or the red light to form the warm white light having the minimum color temperature.

Figure 3:
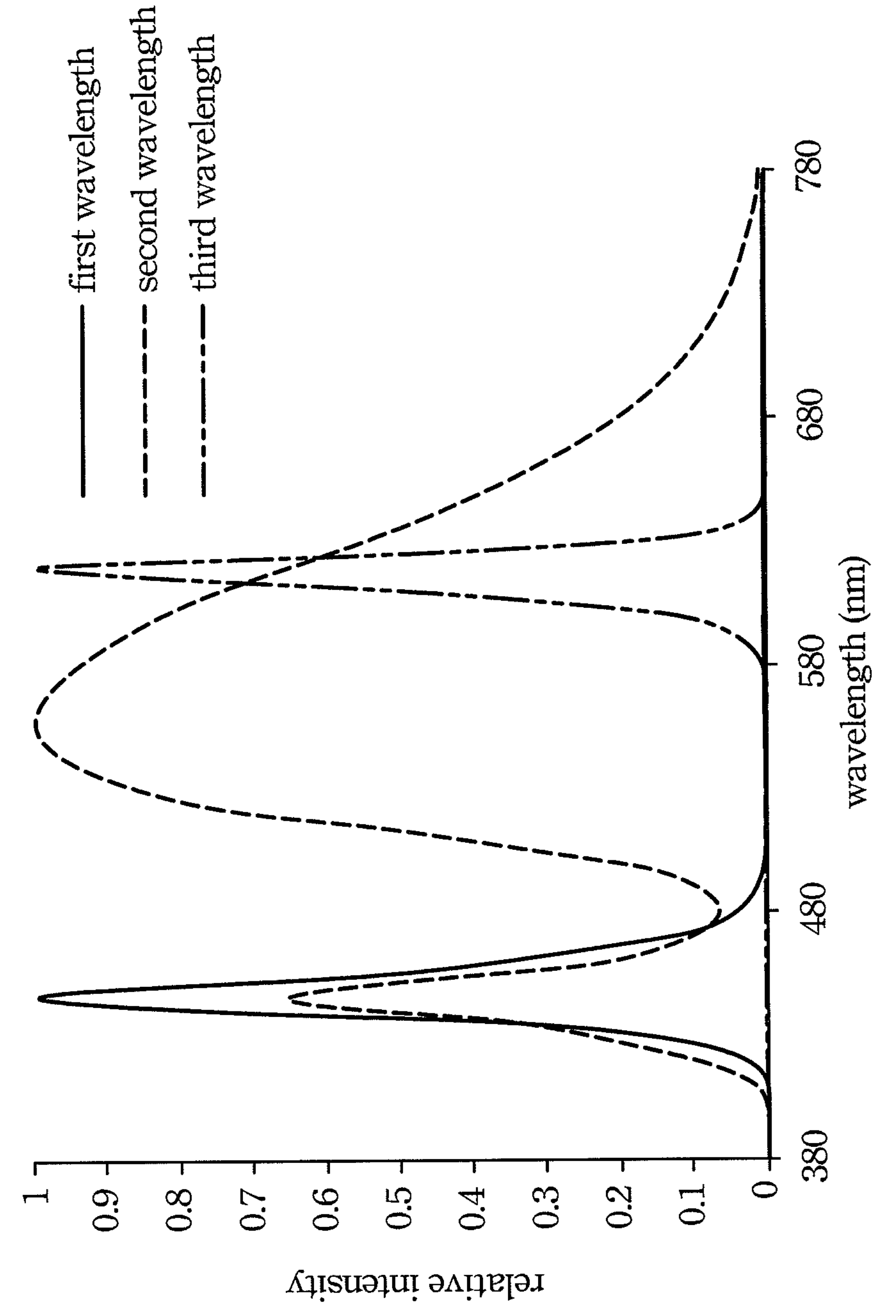
FIG. 3 is a schematic diagram of wavelength versus relative intensity according to one embodiment of the present invention.

FIG. 3 is a schematic diagram of wavelength versus relative intensity according to one embodiment of the present invention. As shown in FIG. 1 and FIG. 3, the light emitted by the first light-emitting device 110 has the first wavelength in a waveband corresponding to the blue light, and the first wavelength can be smaller than approximately 480 nm in one embodiment and can approximately range between 440 nm and 460 nm in another embodiment; the light emitted by the second light-emitting device 120 has the second wavelength in a waveband corresponding to the red light, and the second wavelength can be greater than 570 nm in one embodiment, and can range between 580 nm and 630 nm in another embodiment; the light emitted by the third light-emitting device 130 can include the light having the first wavelength and the light having a wavelength ranging between 480 nm and 570 nm.

On the other hand, when the first wavelength and second wavelength change, the corresponding coordinate points which represent the light having the first wavelength and the light having the second wavelength change as well such that the corresponding coordinate point which represents the light having the third wavelength changes accordingly. For example, when the first wavelength ranges between 440 nm and 460 nm and the second wavelength ranges between 580 nm and 630 nm, the corresponding coordinate point (X, Y) which represents the light having the third wavelength has an X coordinate ranging between 0.336 and 0.421, and a Y coordinate ranging between 0.3915 and 0.4911.

In another embodiment, the first wavelength can approximately range between 440 nm and 460 nm, the second wavelength can approximately range between 580 nm and 630 nm, and the corresponding coordinate point which represents the light having the third wavelength can be located within an area defined by a first coordinate point (0.3360, 0.4004), a second coordinate point (0.3790, 0.4911), a third coordinate point (0.3770, 0.3915), and a fourth coordinate point (0.4210, 0.4653).

Figure 4:
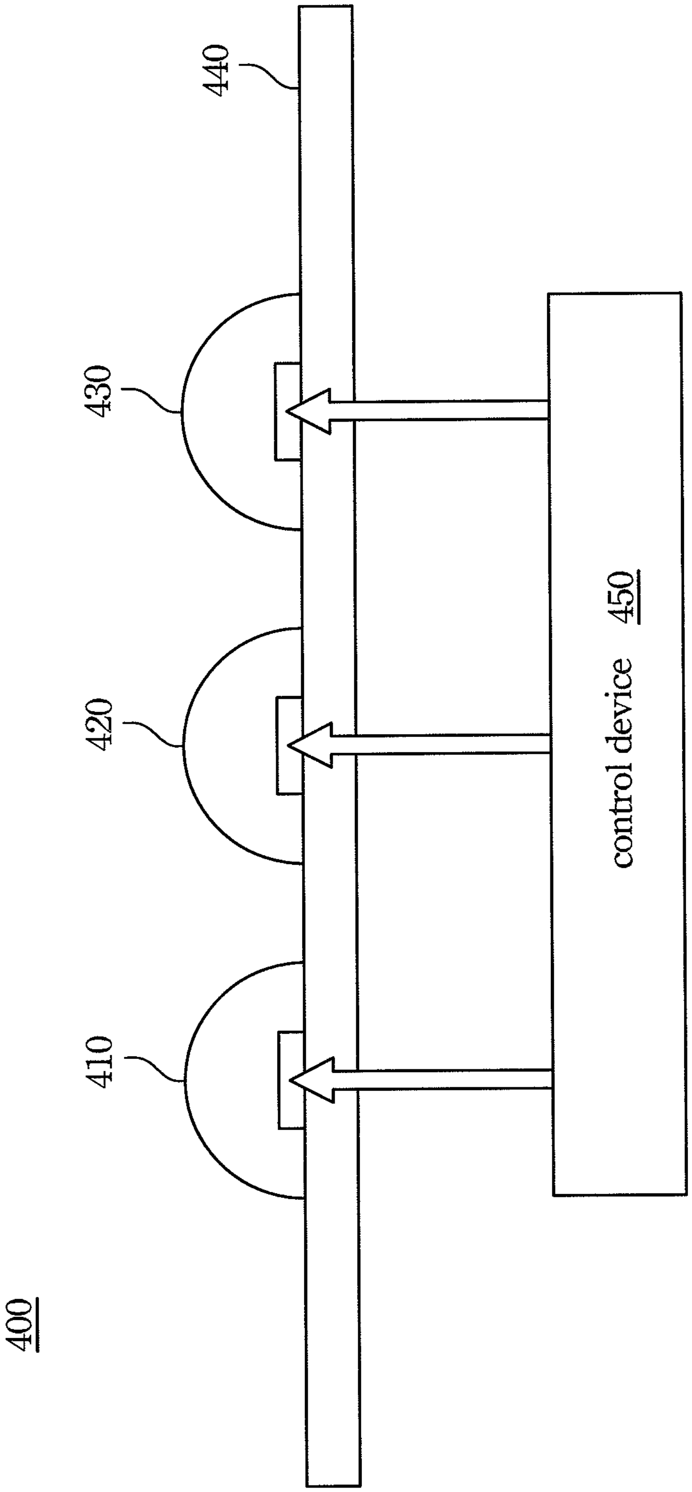
FIG. 4 is a schematic diagram illustrating an illumination apparatus according to another embodiment of the present invention.

FIG. 4 is a schematic diagram illustrating an illumination apparatus according to another embodiment of the present invention. The illumination apparatus 400 includes a first light-emitting device 410, a second light-emitting device 420, a third light-emitting device 430, a carrier 440, and a control device 450, wherein the first light-emitting device 410, the second light-emitting device 420 and the third light-emitting device 430 are disposed on the carrier 440, and the first light-emitting device 410, the second light-emitting device 420 and the third light-emitting device 430 emit the corresponding lights according to the embodiments shown in FIG. 1, FIG. 2 and FIG. 3, to be selectively mixed to form the required white light. The control device 450 is electrically connected to the first light-emitting device 410, the second light-emitting device 420 and the third light-emitting device 430 for controlling the first light-emitting device 410, the second light-emitting device 420 and the third light-emitting device 430 to modify light-emitting intensities of the first light-emitting device 410, the second light-emitting device 420 and the third light-emitting device 430 such that the lights emitted therefrom can be mixed to form the white light represented by the coordinate point substantially located on the Black Body Locus. Notably, the structure in FIG. 4 is schematically shown for convenience of illustration and is not limiting of the present invention as well.

In practice, the control device 450 can be a control circuit with a three-phase output for respectively controlling the light-emitting devices, and the control device 450 can also be implemented by a single control circuit, a single control chip or other feasible driving control circuits, and thus it is not limited thereto.

Under the condition of the control device 450 for controlling the light-emitting devices, a ratio of the light-emitting intensity of the first light-emitting device 410 to that of the third light-emitting device 430 approximately ranges between 0 and 0.8, and a ratio of the light-emitting intensity of the second light-emitting device 420 to that of the third light-emitting device 430 approximately ranges between 0 and 0.8, such that the lights emitted by the first light-emitting device 410, the second light-emitting device 420 and the third light-emitting device 430 can be mixed appropriately to form the white light represented by the coordinate point substantially located on the Black Body Locus.

On the other hand, the control device 450 can further control a ratio of the correspondingly light-emitting intensities of the first light-emitting device 410, the second light-emitting device 420 and the third light-emitting device 430 so as to modify the corresponding coordinate point located on the Black Body Locus, which represents the formed white light for regulating the color temperature of the white light emitted by the illumination apparatus 400.

Figure 5A:
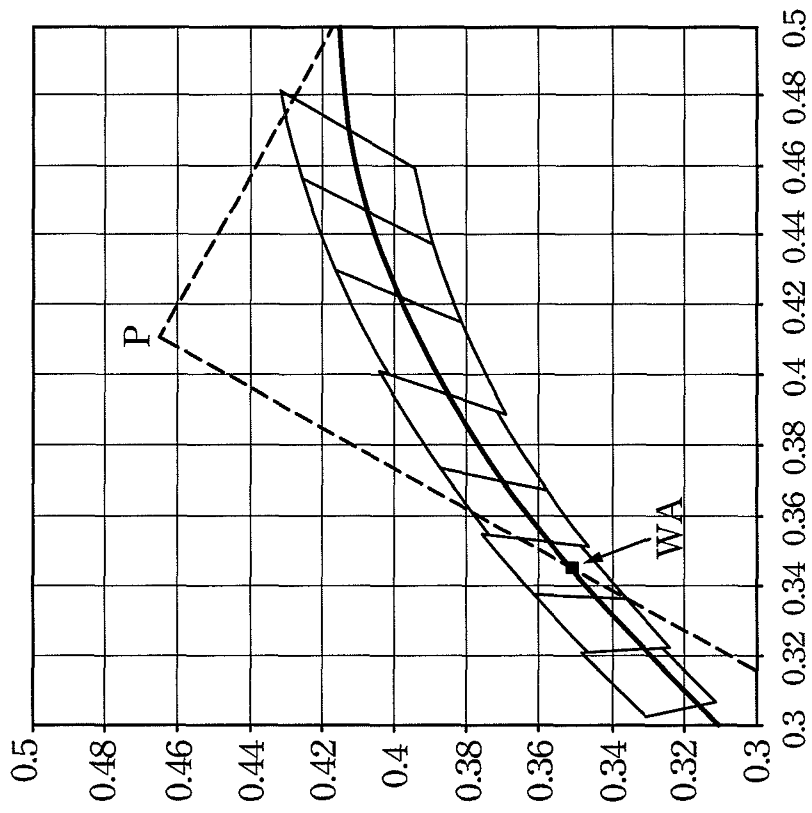
FIG. 5A to FIG. 5F are schematic diagrams illustrating variations of the color temperature of the white light based on different ratios of the light-emitting intensities of the light-emitting devices according to one embodiment of the present invention.

FIG. 5A to FIG. 5F are schematic diagrams illustrating variations of the color temperature of the white light based on different ratios of the light-emitting intensities of the light-emitting devices according to one embodiment of the present invention. As shown in FIG. 4 and FIG. 5A, when the first wavelength is approximately 450 nm, the second wavelength is approximately 615 nm, and the color temperature of the white light formed by the mixture of the light having the first wavelength, the light having the second wavelength and the light having the third wavelength is approximately 5000 K (which is represented by the coordinate point WA), the light-emitting intensities of the first light-emitting device 410, the second light-emitting device 420 and the third light-emitting device 430 are in the ratio of 0.18:0:1; that is, the required cold white light can be formed almost by only mixing the lights emitted by the first light-emitting device 410 and the third light-emitting device 430.

Figure 5B:
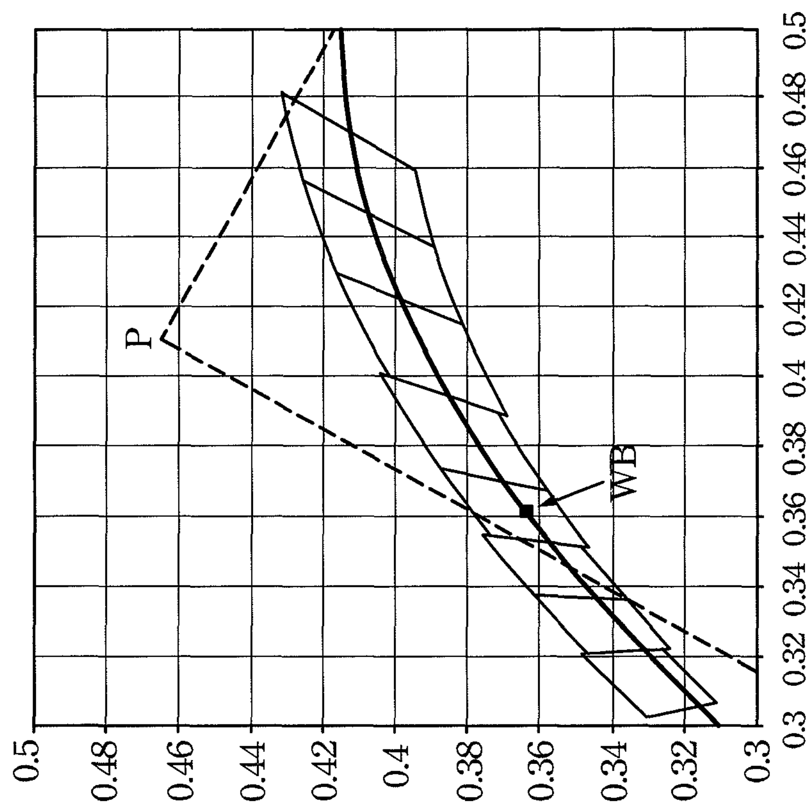

As shown in FIG. 4 and FIG. 5B, when the first wavelength is approximately 450 nm, the second wavelength is approximately 615 nm, and the color temperature of the white light formed by the mixture of the light having the first wavelength, the light having the second wavelength and the light having the third wavelength is approximately 4500 K (which is represented by the coordinate point WB), the light-emitting intensities of the first light-emitting device 410, the second light-emitting device 420 and the third light-emitting device 430 are in the ratio of 0.14:0.04:1.

Figure 5C:
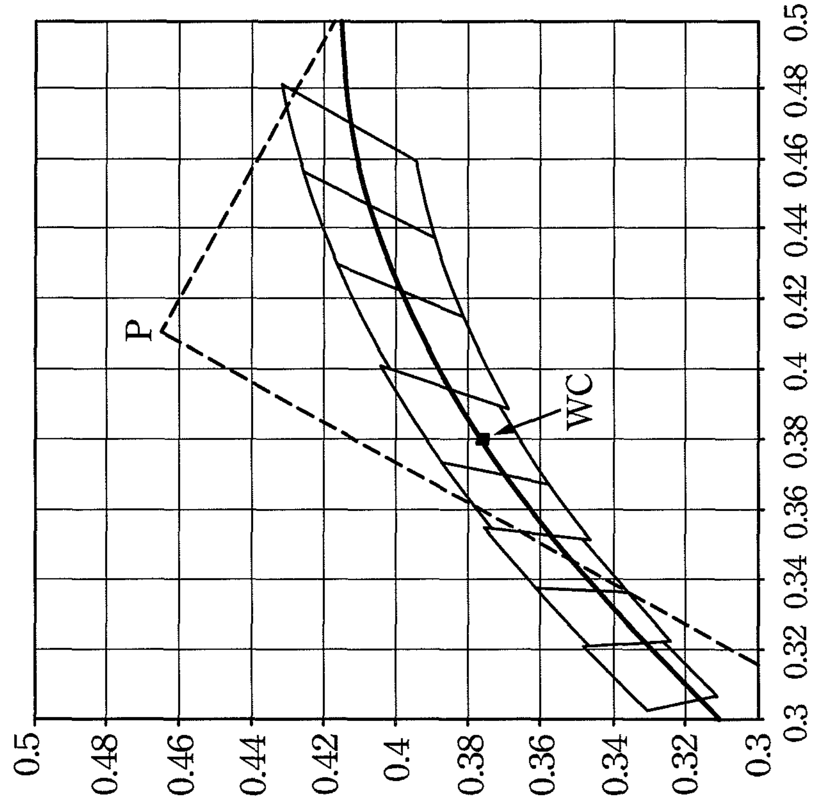

As shown in FIG. 4 and FIG. 5C, when the first wavelength is approximately 450 nm, the second wavelength is approximately 615 nm, and the color temperature of the white light formed by the mixture of the light having the first wavelength, the light having the second wavelength and the light having the third wavelength is approximately 4000 K (which is represented by the coordinate point WC), the light-emitting intensities of the first light-emitting device 410, the second light-emitting device 420 and the third light-emitting device 430 are in the ratio of 0.10:0.08:1.

Figure 5D:
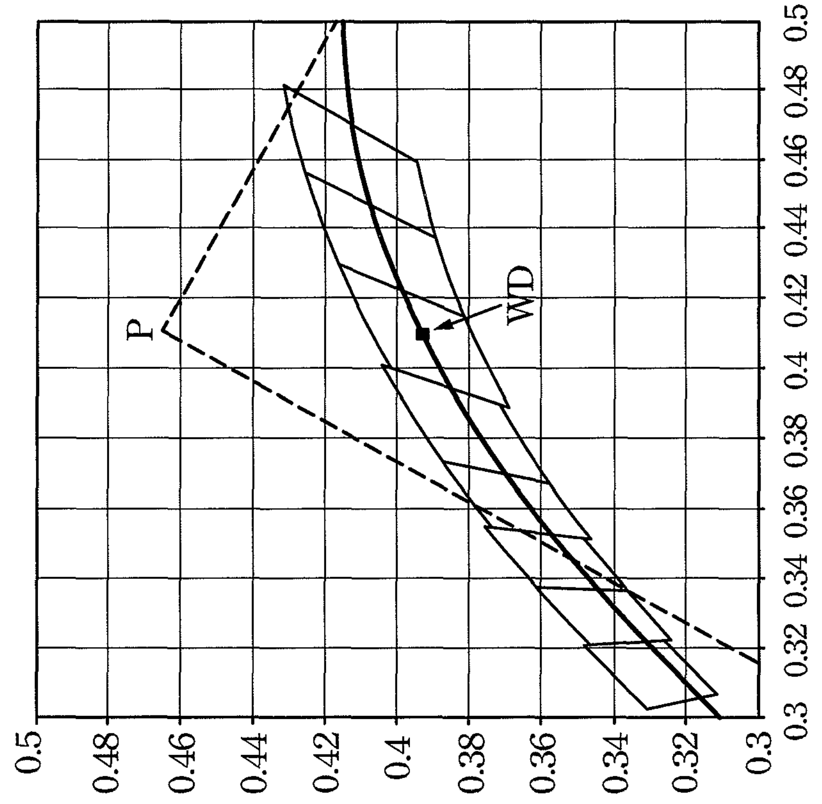

As shown in FIG. 4 and FIG. 5D, when the first wavelength is approximately 450 nm, the second wavelength is approximately 615 nm, and the color temperature of the white light formed by the mixture of the light having the first wavelength, the light having the second wavelength and the light having the third wavelength is approximately 3500 K (which is represented by the coordinate point WD), the light-emitting intensities of the first light-emitting device 410, the second light-emitting device 420 and the third light-emitting device 430 are in the ratio of 0.07:0.14:1.

Figure 5F:
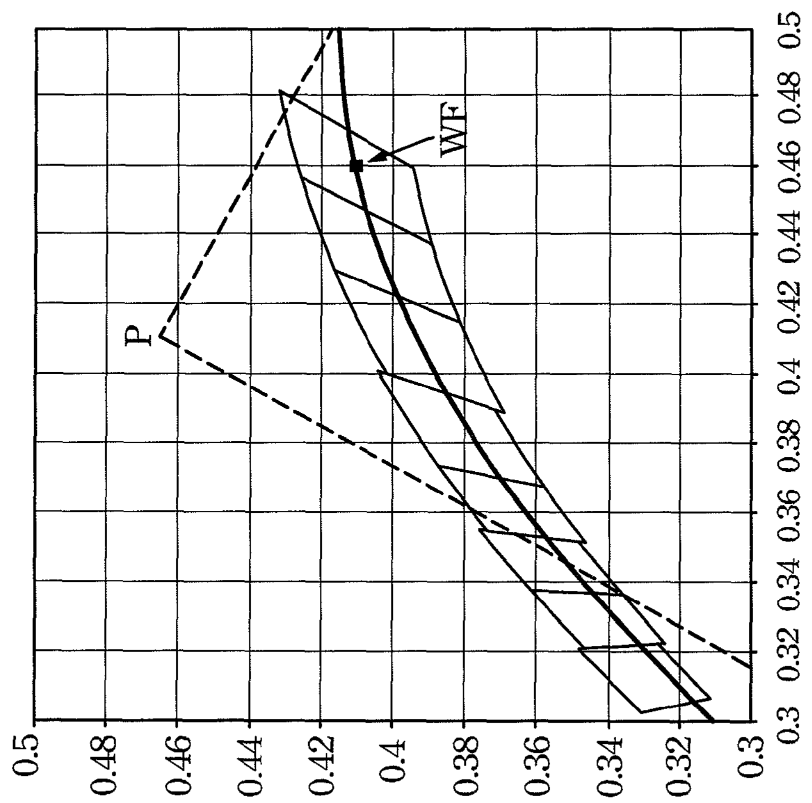
Figure 5E:
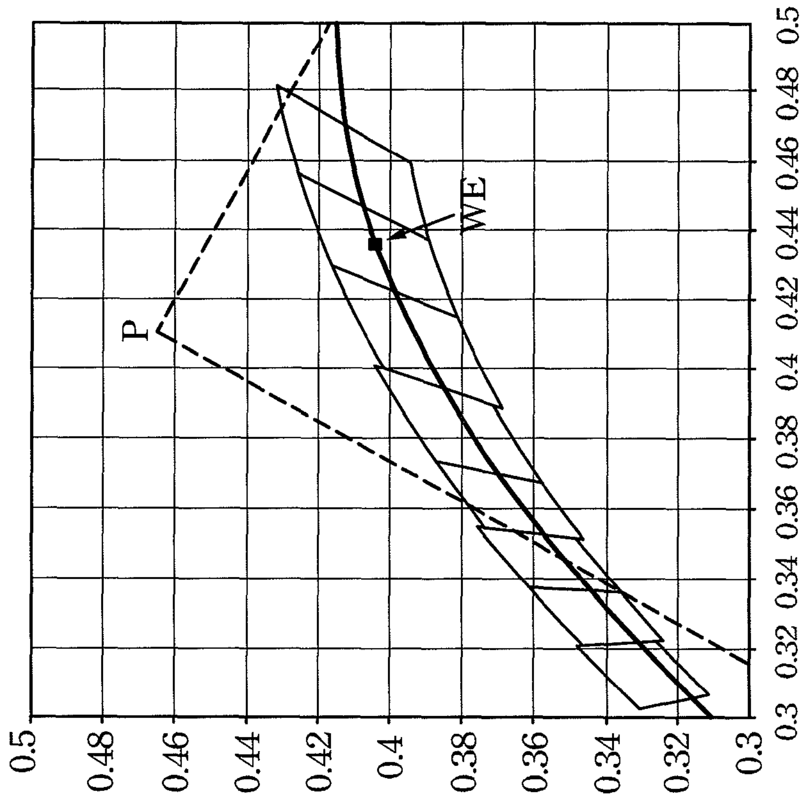

As shown in FIG. 4 and FIG. 5E, when the first wavelength is approximately 450 nm, the second wavelength is approximately 615 nm, and the color temperature of the white light formed by the mixture of the light having the first wavelength, the light having the second wavelength and the light having the third wavelength is approximately 3000 K (which is represented by the coordinate point WE), the light-emitting intensities of the first light-emitting device 410, the second light-emitting device 420 and the third light-emitting device 430 are in the ratio of 0.03:0.23:1.

As shown in FIG. 4 and FIG. 5F, when the first wavelength is approximately 450 nm, the second wavelength is approximately 615 nm, and the color temperature of the white light formed by the mixture of the light having the first wavelength, the light having the second wavelength and the light having the third wavelength is approximately 2700 K (which is represented by the coordinate point WF), the light-emitting intensities of the first light-emitting device 410, the second light-emitting device 420 and the third light-emitting device 430 are in the ratio of 0.01:0.31:1; that is, the required warm white light can be formed almost by only mixing the lights emitted by the second light-emitting device 420 and the third light-emitting device 430.

As illustrated above, modifying the ratio of the light-emitting intensities of the first light-emitting device 410, the second light-emitting device 420 and the third light-emitting device 430 can render the coordinate point, which represents the formed white light, accurately located on the Black Body Locus, thereby preventing the color of the formed white light from being apparently deviated, and the operation of light mixture can be performed flexibly such that the color of the white light formed based on the operation of light mixture is relatively uniform, and the amount of the required light-emitting devices can be reduced such that the size of the illumination apparatus itself can be reduced and the production cost can be reduced as well to lower the price of the illumination apparatus.

Notably, although only three light-emitting devices and the operation of modifying the light-emitting intensities of the three light-emitting devices are disclosed in the aforementioned embodiments, they are merely shown exemplarily for convenience of illustration and not limiting of the present invention; in other words, persons of ordinary skill in the art may utilize one or more light-emitting devices according to practical needs in order for forming the required white light by mixing the lights emitted therefrom.

In addition, when the light-emitting devices are fabricated, the light-emitting devices can be fabricated with a conventional substrate (e.g., substrate of ZnSe, $Al_2O_3$, ZnS, GaP), light-emitting layers (e.g., light-emitting layer of ZnSe, GaN, ZnS, GaP) or fluorescent material (e.g., fluorescent material of YAG, $SrGa_2S_4$, SrS), and by the manner of metal organic chemical vapor deposition (MOCVD), liquid phase epitaxy (LPE) or vapor phase epitaxy (VPE); however, the fabrication material and manner are not limited thereto.

Figure 6:
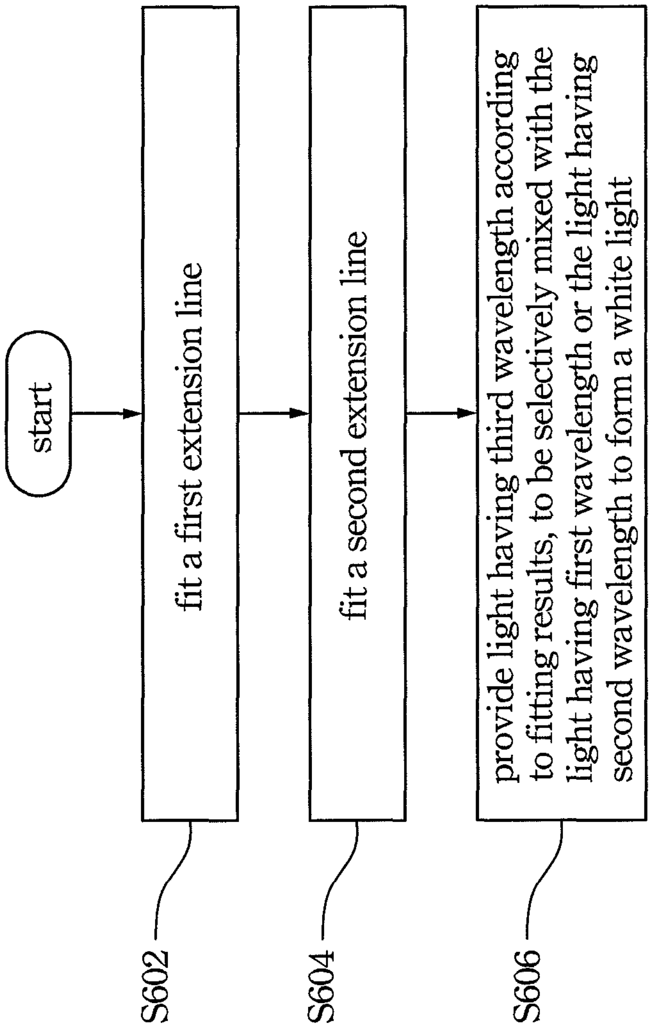
FIG. 6 is a flowchart of a method for generating a white light according to one embodiment of the present invention.

FIG. 6 is a flowchart of a method for generating a white light according to one embodiment of the present invention. Referring to FIG. 2 and FIG. 6, a first extension line L1 is first fitted through the coordinate point (e.g., the coordinate point B) which represents the light having the first wavelength and the coordinate point (e.g., the coordinate point W1) which represents the white light having a maximum color temperature within a color temperature range and is substantially located on the Black Body Locus 200 on the CIE chromaticity diagram (Step 602). Moreover, a second extension line L2 is fitted through the coordinate point (e.g., the coordinate point R) which represent the light having the second wavelength and the coordinate point (e.g., the coordinate point W2) which represents the white light having a minimum color temperature within the color temperature range and is substantially located on the Black Body Locus 200 on the CIE chromaticity diagram (Step 604). Then, a light having the third wavelength is provided according to fitting results (Step 606) and selectively mixed with the light having the first wavelength and the light having the second wavelength to form a white light which is represented by the chromaticity coordinate point substantially located on the Black Body Locus 200, in which a coordinate point which represents the light having the third wavelength on the CIE chromaticity diagram is substantially located where the first extension line L1 intersects with the second extension line L2 (e.g., the coordinate point P). Preferably, the first wavelength approximately ranges between 440 nm and 460 nm, and the second wavelength approximately ranges between 580 nm and 630 nm.

It is notable that the steps are not necessarily recited in sequence in which the steps are performed. That is, unless the sequence of the steps is expressly indicated, the sequence of the steps is interchangeable, and all or part of the steps may be simultaneously, partially simultaneously, or sequentially performed, and thus the flowchart shown in FIG. 6 is merely one embodiment and not limiting of the present invention; in other words, Step 602 and Step 604 can be performed simultaneously or interchangeably and are not limited to those shown in FIG. 6.

In one embodiment, the method for generating the white light can further include the operation of modifying and mixing the light having the first wavelength (corresponding to the coordinate point B), the light having the second wavelength (corresponding to the coordinate point R) and the light having the third wavelength (corresponding to the coordinate point P) so as to form the white light which is represented by the chromaticity coordinate point substantially located on the Black Body Locus 200, in which a ratio of a light-emitting intensity of the light having the first wavelength to that of the light having the third wavelength approximately ranges between 0 and 0.8, and a ratio of a light-emitting intensity of the light having the second wavelength to that of the light having the third wavelength approximately ranges between 0 and 0.8 such that the light having the first wavelength, the light having the second wavelength and the light having the third wavelength can be mixed appropriately to form the white light represented by the coordinate point substantially located on the Black Body Locus.

In another embodiment, the method for generating the white light can further include the operation of mixing the light having the first wavelength (corresponding to the coordinate point B) and the light having the third wavelength (corresponding to the coordinate point P) to form the white light having the maximum color temperature and represented by the coordinate point W1 substantially located on the Black Body Locus. Furthermore, the method for generating the white light can further include the operation of mixing the light having the second wavelength (corresponding to the coordinate point R) and the light having the third wavelength (corresponding to the coordinate point P) to form the white light having the minimum color temperature and represented by the coordinate point W2 substantially located on the Black Body Locus.

In still another embodiment, the coordinate point (X, Y) which represents the light having the third wavelength on the CIE chromaticity diagram has an X coordinate approximately ranging between 0.336 and 0.421, and a Y coordinate approximately ranging between 0.3915 and 0.4911. Moreover, the corresponding coordinate point (e.g., the coordinate point P) which represents the light having the third wavelength on the CIE chromaticity diagram is located within an area defined by a first coordinate point (0.3360, 0.4004), a second coordinate point (0.3790, 0.4911), a third coordinate point (0.3770, 0.3915), and a fourth coordinate point (0.4210, 0.4653).

As illustrated from the embodiments of the present invention, when the illumination apparatus and the method for generating the white light are applied, not only the coordinate point representing the formed white light can be located on the Black Body Locus by modifying the ratio of the light-emitting intensities of the three light-emitting devices, thereby preventing the color of the formed white light from being apparently deviated, but also the operation of light mixture can be performed more flexibly such that the color of the white light formed based on the operation of light mixture is relatively uniform, and the amount of the required light-emitting devices can be reduced such that the size of the illumination apparatus itself can be reduced and the production cost can be reduced as well to lower the price of the illumination apparatus.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. An illumination apparatus comprising:

a first light-emitting device for emitting a light having a first wavelength;

a second light-emitting device for emitting a light having a second wavelength; and a third light-emitting device for emitting a light having a third wavelength to be selectively mixed with the light having the first wavelength or the light having the second wavelength to form a white light represented by a chromaticity coordinate point substantially located on a Black Body Locus on a CIE chromaticity diagram;

wherein a color of the light having the third wavelength is determined by a linear relationship between corresponding coordinate points which represent the light having the first wavelength and a white light having a first color temperature on the CIE chromaticity diagram, and by a linear relationship between corresponding coordinate points which represent the light having the second wavelength and a white light having a second color temperature on the CIE chromaticity diagram.

2. The illumination apparatus as claimed in claim 1, wherein a first extension line is fitted through the corresponding coordinate points which represent the light having the first wavelength and the white light having the first color temperature on the CIE chromaticity diagram, a second extension line is fitted through the corresponding coordinate points which represent the light having the second wavelength and the white light having the second color temperature on the CIE chromaticity diagram, and a coordinate point which represents the light having the third wavelength on the CIE chromaticity diagram is substantially located where the first extension line intersects with the second extension line.

3. The illumination apparatus as claimed in claim 1, wherein the light having the third wavelength is mixed with a blue light to form a white light having a maximum color temperature within a color temperature range on the Black Body Locus.

4. The illumination apparatus as claimed in claim 1, wherein the light having the third wavelength is mixed with a red light to form a white light having a minimum color temperature within a color temperature range on the Black Body Locus.

5. The illumination apparatus as claimed in claim 1, wherein the light having the third wavelength is mixed with the light having the first wavelength to form the white light having the first color temperature, and the light having the third wavelength is mixed with the light having the second wavelength to form the white light having the second color temperature.

6. The illumination apparatus as claimed in claim 1, wherein a coordinate point which represents the light having the third wavelength on the CIE chromaticity diagram is not located on the Black Body Locus.

7. The illumination apparatus as claimed in claim 1, wherein a coordinate point (X, Y) which represents the light having the third wavelength on the CIE chromaticity diagram has an X coordinate ranging between 0.336 and 0.421, and a Y coordinate ranging between 0.3915 and 0.4911.

8. The illumination apparatus as claimed in claim 1, wherein a coordinate point which represents the light having the third wavelength on the CIE chromaticity diagram is located within an area defined by a first coordinate point (0.3360, 0.4004), a second coordinate point (0.3790, 0.4911), a third coordinate point (0.3770, 0.3915), and a fourth coordinate point (0.4210, 0.4653).

9. The illumination apparatus as claimed in claim 1, further comprising:

a control device for controlling the first light-emitting device, the second light-emitting device and the third light-emitting device to modify light-emitting intensities of the first light-emitting device, the second light-emitting device and the third light-emitting device.

10. The illumination apparatus as claimed in claim 9, wherein a ratio of the light-emitting intensity of the first light-emitting device to that of the third light-emitting device ranges between 0 and 0.8, and a ratio of the light-emitting intensity of the second light-emitting device to that of the third light-emitting device ranges between 0 and 0.8.

11. The illumination apparatus as claimed in claim 9, wherein when the first wavelength is 450 nm, the second wavelength is 615 nm, and a color temperature of the white light formed by the mixture of the light having the first wavelength, the light having the second wavelength and the light having the third wavelength is 5000 K, the light-emitting intensities of the first light-emitting device, the second light-emitting device and the third light-emitting device are in a ratio of 0.18:0:1.

12. The illumination apparatus as claimed in claim 9, wherein when the first wavelength is 450 nm, the second wavelength is 615 nm, and a color temperature of the white light formed by the mixture of the light having the first wavelength, the light having the second wavelength and the light having the third wavelength is 4500 K, the light-emitting intensities of the first light-emitting device, the second light-emitting device and the third light-emitting device are in a ratio of 0.14:0.04:1.

13. The illumination apparatus as claimed in claim 9, wherein when the first wavelength is 450 nm, the second wavelength is 615 nm, and a color temperature of the white light formed by the mixture of the light having the first wavelength, the light having the second wavelength and the light having the third wavelength is 4000 K, the light-emitting intensities of the first light-emitting device, the second light-emitting device and the third light-emitting device are in a ratio of 0.10:0.08:1.

14. The illumination apparatus as claimed in claim 9, wherein when the first wavelength is 450 nm, the second wavelength is 615 nm, and a color temperature of the white light formed by the mixture of the light having the first wavelength, the light having the second wavelength and the light having the third wavelength is 3500 K, the light-emitting intensities of the first light-emitting device, the second light-emitting device and the third light-emitting device are in a ratio of 0.07:0.14:1.

15. The illumination apparatus as claimed in claim 9, wherein when the first wavelength is 450 nm, the second wavelength is 615 nm, and a color temperature of the white light formed by the mixture of the light having the first wavelength, the light having the second wavelength and the light having the third wavelength is 3000 K, the light-emitting intensities of the first light-emitting device, the second light-emitting device and the third light-emitting device are in a ratio of 0.03:0.23:1.

16. The illumination apparatus as claimed in claim 9, wherein when the first wavelength is 450 nm, the second wavelength is 615 nm, and a color temperature of the white light formed by the mixture of the light having the first wavelength, the light having the second wavelength and the light having the third wavelength is 2700 K, the light-emitting intensities of the first light-emitting device, the second light-emitting device and the third light-emitting device are in a ratio of 0.01:0.31:1.

17. The illumination apparatus as claimed in claim 1, wherein the first wavelength is smaller than 480 nm and the second wavelength is greater than 570 nm.

18. A method for generating a white light, comprising:

fitting a first extension line through a coordinate point which represents a light having a first wavelength and a coordinate point which represents a white light having a maximum color temperature within a color temperature range and is substantially located on a Black Body Locus on a CIE chromaticity diagram;

fitting a second extension line through a coordinate point which represent a light having a second wavelength and a coordinate point which represent a white light having a minimum color temperature within the color temperature range and is substantially located on the Black Body Locus; and providing a light having a third wavelength according to fitting results to be selectively mixed with the light having the first wavelength or the light having the second wavelength to form a white light, wherein a coordinate point which represents the light having the third wavelength on the CIE chromaticity diagram is substantially located where the first extension line intersects with the second extension line.

19. The method as claimed in claim 18, further comprising:

modifying and mixing the light having the first wavelength, the light having the second wavelength and the light having the third wavelength, wherein a ratio of a light-emitting intensity of the light having the first wavelength to that of the light having the third wavelength ranges between 0 and 0.8, and a ratio of a light-emitting intensity of the light having the second wavelength to that of the light having the third wavelength ranges between 0 and 0.8.

20. The method as claimed in claim 18, further comprising:

mixing the light having the first wavelength and the light having the third wavelength to form the white light having the maximum color temperature and represented by the coordinate point substantially located on the Black Body Locus.

21. The method as claimed in claim 18, further comprising:

mixing the light having the second wavelength and the light having the third wavelength to form the white light having the minimum color temperature and represented by the coordinate point substantially located on the Black Body Locus.

22. The method as claimed in claim 18, wherein the coordinate point which represents the light having the third wavelength on the CIE chromaticity diagram is located within an area defined by a first coordinate point (0.3360, 0.4004), a second coordinate point (0.3790, 0.4911), a third coordinate point (0.3770, 0.3915), and a fourth coordinate point (0.4210, 0.4653).

23. The method as claimed in claim 18, wherein a coordinate point (X, Y) which represents the light having the third wavelength on the CIE chromaticity diagram has an X coordinate ranging between 0.336 and 0.421, and a Y coordinate ranging between 0.3915 and 0.4911.

24. The method as claimed in claim 18, wherein the first wavelength ranges between 440 nm and 460 nm, and the second wavelength ranges between 580 nm and 630 nm.

* * * * *